(12) United States Patent
Thomas et al.

(10) Patent No.: US 12,379,435 B2
(45) Date of Patent: Aug. 5, 2025

(54) THERMAL BUS STRUCTURE FOR A MAGNETIC RESONANCE IMAGING DEVICE

(71) Applicant: Siemens Healthcare Limited, Camberley (GB)

(72) Inventors: Adrian Mark Thomas, Bicester (GB); Simon Chorley, Oxford (GB); Nicholas Aley, Maldon/Essex (GB)

(73) Assignee: Siemens Healthcare Limited, Camberley (GB)

( * ) Notice: Subject to any disclaimer, the term of this patent is extended or adjusted under 35 U.S.C. 154(b) by 140 days.

(21) Appl. No.: 18/215,877

(22) Filed: Jun. 29, 2023

(65) Prior Publication Data

US 2024/0004009 A1 Jan. 4, 2024

(30) Foreign Application Priority Data

Jun. 29, 2022 (EP) ..................................... 22275084

(51) Int. Cl.
| | | |
|---|---|---|
| G01R 33/38 | (2006.01) | |
| G01R 33/34 | (2006.01) | |
| G01R 33/3815 | (2006.01) | |
| G01R 33/385 | (2006.01) | |
| G01R 33/421 | (2006.01) | |

(52) U.S. Cl.
CPC ... G01R 33/3804 (2013.01); G01R 33/34053 (2013.01); G01R 33/3815 (2013.01); G01R 33/385 (2013.01); G01R 33/4215 (2013.01)

(58) Field of Classification Search
CPC .......... G01R 33/3804; G01R 33/34053; G01R 33/3815; G01R 33/385; G01R 33/4215; G01R 33/3802
See application file for complete search history.

(56) References Cited

U.S. PATENT DOCUMENTS

| | | | | |
|---|---|---|---|---|
| 5,563,566 | A * | 10/1996 | Laskaris | ............ G01R 33/3806 324/318 |
| 2006/0225437 | A1* | 10/2006 | Kazami | ................. F25D 29/001 62/51.1 |
| 2012/0184444 | A1 | 7/2012 | Blumenthal et al. | |
| 2014/0135615 | A1* | 5/2014 | Kruip | .................... A61N 5/1081 600/411 |
| 2014/0274721 | A1 | 9/2014 | Calvert | |

(Continued)

FOREIGN PATENT DOCUMENTS

| | | |
|---|---|---|
| GB | 2490189 A | 10/2012 |
| WO | 2013079347 A1 | 6/2013 |
| WO | 2014160795 A1 | 10/2014 |

*Primary Examiner* — Daniel R Miller
(74) *Attorney, Agent, or Firm* — Banner & Witcoff Ltd.

(57) ABSTRACT

The disclosure relates to a magnetic resonance imaging device comprising a main magnet, a gradient system including at least one gradient coil, a thermal bus structure, a shield structure arranged between the gradient system and the main magnet and a cryocooler including a cold head, wherein the shield structure is configured to reduce a transport of heat energy to the main magnet and wherein the main magnet comprises a magnet spacer configured for spacing individual coils of the main magnet, wherein the thermal bus structure comprises at least one thermal bus element extending through the magnet spacer for providing a thermal connection between the cold head of the cryocooler and the shield structure.

20 Claims, 8 Drawing Sheets

(56) References Cited

U.S. PATENT DOCUMENTS

| 2014/0274722 | A1 | 9/2014 | Calvert et al. |
| 2016/0054406 | A1 | 2/2016 | Laskaris et al. |
| 2019/0187228 | A1 | 6/2019 | Overweg |
| 2021/0223339 | A1* | 7/2021 | Zou .................... G01R 33/4215 |

* cited by examiner

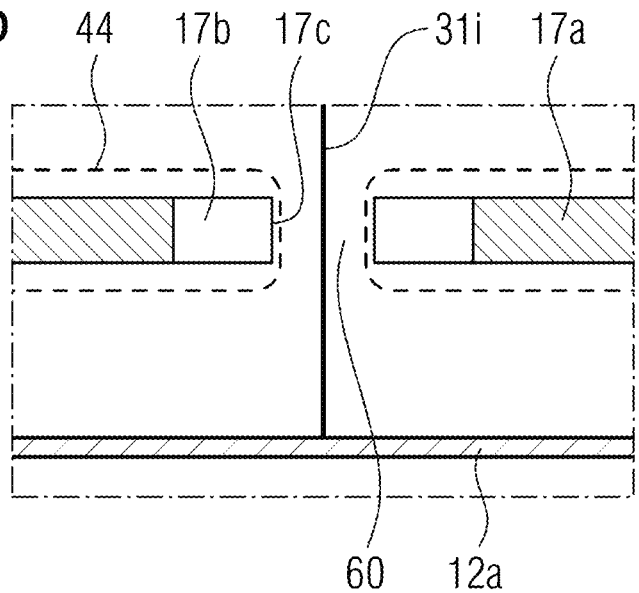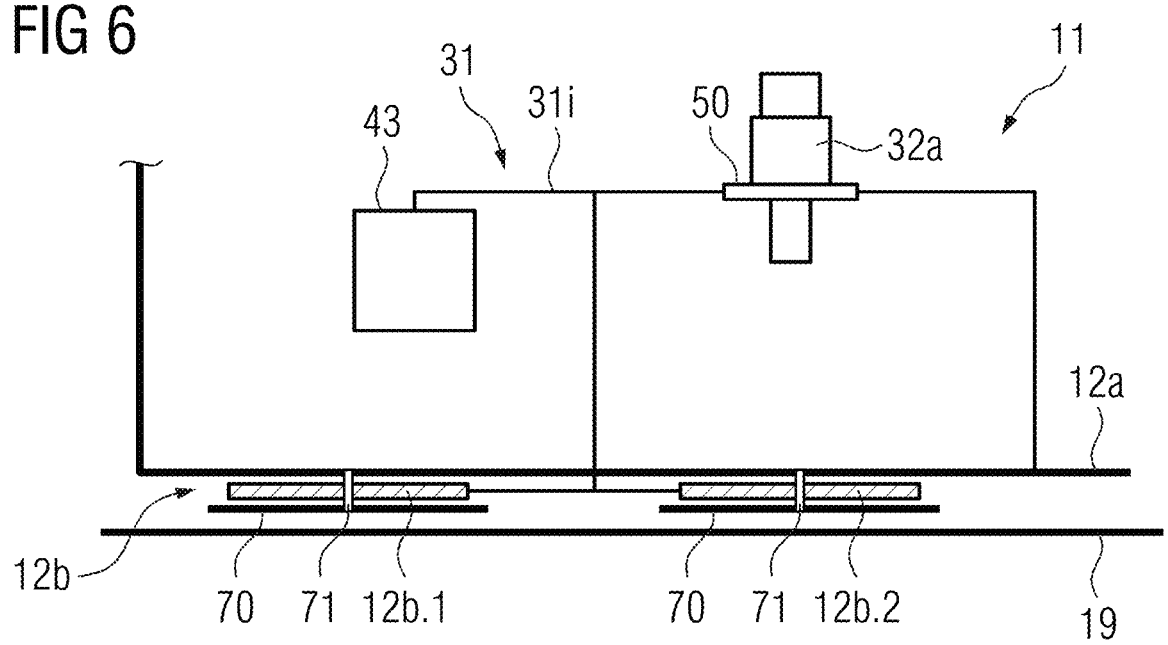

THERMAL BUS STRUCTURE FOR A MAGNETIC RESONANCE IMAGING DEVICE

CROSS-REFERENCE TO RELATED APPLICATIONS

The present application claims priority to and the benefit of Europe patent application no. EP 22275084.6, filed on Jun. 29, 2022, the contents of which are incorporated herein by reference in their entirety.

TECHNICAL FIELD

The disclosure relates to a method for to improving a thermal design of a magnetic resonance imaging device.

BACKGROUND

Magnetic resonance tomography represents a prominent imaging method for acquiring images of an interior of an examination object. For carrying out a magnetic resonance measurement, the examination object is usually positioned in a strong and homogeneous static magnetic field (B0 field) of a magnetic resonance imaging device. The static magnetic field may comprise magnetic field strengths of 0.2 Tesla to 7 Tesla, thus aligning nuclear spins inside the examination object along the static magnetic field. For triggering so-called nuclear spin resonances, radiofrequency excitation pulses are emitted into the examination subject. Each radiofrequency excitation pulse causes a magnetization of nuclear spins within the examination object to deviate from the static magnetic field by an amount which is known as the flip angle. A radiofrequency excitation pulse may comprise an alternating (electro) magnetic field with a frequency which corresponds to the Larmor frequency at the respective static magnetic field strength. Excited nuclear spins may exhibit a rotating and decaying magnetization (nuclear magnetic resonance), which can be detected using dedicated radiofrequency antennas. For spatial encoding of measured data, rapidly switched magnetic gradient fields are superimposed on the static magnetic field.

The received nuclear magnetic resonances are typically digitized and stored as complex values in a k-space matrix. This k-space matrix can be used as a basis for a reconstruction of magnetic resonance images and for determining spectroscopic data. A magnetic resonance image is typically reconstructed by means of a multi-dimensional Fourier transformation of the k-space matrix.

A superconducting magnet of a magnetic resonance imaging device typically requires a cryostat to keep it cold. In some devices, the cryostat comprises a thermal shield at an intermediate temperature (i. e. at around 50 K) and is configured to reduce a transfer of heat energy onto the main magnet, which is usually kept at a superconducting temperature of around 4 K. The thermal shield separates the superconducting magnet of the magnetic resonance imaging device from a warm patient bore comprising the imaging region. The thermal shield is typically made of different aluminum alloys, e.g. having a low thermal emissivity and a high thermal conductivity to provide a high heat transfer rate and reduce thermal radiation onto the superconducting magnet. In closed bore scanners, the thermal shield may be cylindrical in shape, featuring a bore tube section to provide access to the imaging region of the magnetic resonance imaging device.

In a conventional magnetic resonance imaging device, the thermal shield is cooled via a cold head of a cryocooler. The cold head is thermally connected to an outer shell of the thermal shield, thus providing a thermal path around the superconducting magnet with a total length of 1.5 m or more. Consequently, thermal paths between the cold head and remote locations on the bore tube are associated with high a thermal resistance and a high time constant for removal of heat energy from the thermal shield. Conventional designs are therefore limited with respect to a magnitude of static heat loads that can be deposited on the thermal shield. Furthermore, the thermal shield must be strong enough to bear forces generated during the operation of the magnetic resonance imaging device as well as in emergency situations, such as a quench of the superconducting magnet. This complicates the material selection, as the thermal shield must satisfy mechanical, electrical, as well as thermal design constraints.

Furthermore, conventional designs limit the use of energy saving modes involving an adaption of an operational strategy of the cryocooler (i.e. switching the cryocooler on and off or reducing a speed of a compressor of the cryocooler), since the high thermal time constants may cause temperature fluctuations within the thermal shield which may take a long time to recover. Temperature fluctuations are undesirable, as these can interfere with eddy current compensation algorithms, and thus cause image quality problems. Furthermore, temperature fluctuations can cause increased heat-loads on the system, which may lead to Helium boil-off on "wet systems" or reduced ride-through on "dry systems".

SUMMARY

It is therefore an objective of the disclosure to improve a thermal design of a magnetic resonance imaging device. This objective is achieved by a magnetic resonance imaging device according to the embodiments as discussed herein, including the claims.

The magnetic resonance imaging device comprises a main magnet, a gradient system including at least one gradient coil, a thermal bus structure, a shield structure arranged between the gradient system and the main magnet, and a cryocooler including a cold head.

In one embodiment, the magnetic resonance imaging device is configured for acquiring magnetic resonance data from an object positioned within an imaging region of the magnetic resonance imaging device. The magnetic resonance imaging device may be configured for acquiring magnetic resonance image data, particularly diagnostic magnetic resonance image data, from the object positioned within the imaging region. The object may be a patient, particularly a human or an animal.

The magnetic resonance imaging device is a closed bore scanner. A closed bore scanner may comprise a substantially cylindrical bore circumferentially enclosing the imaging region. The main magnet of the closed bore scanner may comprise one or more solenoidal coils encompassing the imaging region along an axial direction or an axis of rotational symmetry of the cylindrical bore. The one or more solenoidal coils may comprise a wire having negligible electrical resistance at (or below) a superconducting temperature. A direction of the main magnetic field provided via the main magnet may be oriented substantially in parallel to a direction of access of the object to the imaging region and/or the axial direction of the cylindrical bore.

In an alternative embodiment, the magnetic resonance imaging device is an open bore scanner. Open bore scanners may be characterized by a magnetic field generation unit which is split into two parts confining the imaging region in two substantially opposing directions. The direction of the main magnetic field may be oriented perpendicular or at a non-zero angle with respect to a direction of access of the imaging object into the imaging region.

The main magnet may comprise or consist of one or more electromagnets or superconducting magnets.

The gradient system comprises one or more gradient coils. A gradient coil may be configured to generate a magnetic gradient field in the imaging region. In an embodiment, the gradient system comprises at least a first gradient coil and a second gradient coil. The first gradient coil may be configured to generate a first magnetic gradient field in the imaging region. Likewise, the second gradient coil may be configured to generate a second magnetic gradient field in the imaging region. The first magnetic gradient field may be oriented essentially perpendicular to the second magnetic gradient field. The gradient system may further comprise a third gradient coil configured to generate a third magnetic gradient field within the imaging region. It is conceivable that the third magnetic gradient field is oriented substantially perpendicular to the first magnetic gradient field and the second magnetic gradient field.

The cryocooler may be configured for cooling components of the magnetic resonance imaging device. For example, the cryocooler may be configured for cooling the main magnet, the gradient system, the thermal bus structure, the shield structure, a buffer unit, and/or a cryostat of the magnetic resonance imaging device. In an embodiment, the cryocooler is configured to provide a temperature below a superconducting temperature of a superconducting material of the main magnet. The cryocooler may comprise a cold head with one or more stages with different temperature levels. For example, the cryocooler may be implemented as a pulse tube refrigerator, a Gifford-McMahon refrigerator, a Stirling cryocooler, a Joule-Thomson cooler, or the like.

The magnetic resonance imaging device may also comprise a cryostat. The cryostat may include a sealed container or vacuum vessel configured for storing or preserving a fluid, e.g. a cryogen, at a predefined temperature level. The predefined temperature level may substantially correspond to a superconducting temperature of the main magnet. For example, a superconducting temperature of the main magnet may be in any suitable range of temperatures, such as e.g. 3 K to 100 K, 3 K to 5 K, 30 K to 60 K, 60 K to 90 K, etc.

The cryostat may comprise a thermal insulation configured for reducing an input of heat energy from components of the magnetic resonance imaging device, the patient bore, and/or an environment of the magnetic resonance imaging device. For example, the thermal insulation may comprise an outer shell and an inner shell for reducing an amount of heat radiation from the outer shell into an inner volume of the cryostat. The cryostat may comprise a vacuum chamber encompassing other components of the cryostat, such as the cryogen vessel, the shield structure, but also the main magnet. Embodiments of the magnetic resonance imaging device including a cryostat may be considered as a "wet system" storing an amount of cryogen in the cryogen vessel.

Alternatively, the magnetic resonance imaging device may be configured as a "dry system" comprising a minimum of cryogen or no cryogen at all. In an embodiment, a cryogen vessel is omitted. Thus, the main magnet may be cooled entirely via thermal conduction. In this case, the magnetic resonance imaging device may still comprise a vacuum chamber encompassing at least the shield structure and the main magnet.

In one embodiment, e.g. in a "wet system", the cryostat comprises a cryogen vessel containing a fluid or a cryogen with a low boiling point like Argon, Nitrogen, Neon, Helium (e. g. in a gaseous form) and the like.

It is conceivable that components of the magnetic resonance imaging device, such as the cryogen vessel, the shield structure, and the like, are thermally connected to the cold head, e.g. via a solid thermal conductor and/or a heat pipe.

It is conceivable that a part of the shield structure, e.g. the thermal shield, is mechanically connected to the cryostat and/or forms an integral part of the cryostat.

However, the magnetic resonance imaging device may also represent a "dry system" comprising a minimum amount of cryogen or no cryogen at all. For example, the main magnet may be cooled exclusively via thermal conduction. The magnetic resonance imaging device may still comprise a vacuum vessel or a suitable thermal insulation configured for reducing the amount of heat energy deposited in the main magnet and keep the main magnet at a desired temperature level. Any thermal buffer usually provided by a liquid cryogen may be provided by a dedicated buffer unit, i.e. a solid material with a sufficiently high thermal mass. Examples of such solid materials are Copper, Aluminum, Bismuth, or the like. At a temperature level of 4 K, this solid material may also comprise or consist of a combination of rare earth materials, such as Gadolinium Oxysulphate (GOS), HoCu, or the like. The composition may be tuned to provide a peak in heat capacity at a desired temperature level.

The shield structure is configured for reducing a transport of heat energy to the main magnet. In an embodiment, the shield structure at least comprises or consists of a dedicated thermal shield configured to reduce a transport of heat energy to the main magnet. A transport of heat energy may be characterized by heat transport mechanisms such as heat conduction, thermal radiation, but also heat convection.

The shield structure and/or the thermal shield may confine the main magnet in a direction facing towards the gradient system. However, the shield structure and/or the thermal shield may also confine the gradient system in a direction facing towards the main magnet.

The thermal shield may consist of a material with high electrical and/or high thermal conductivity. For example, the thermal shield may consist of Copper or Aluminum, particularly high purity Aluminum. The thermal shield may also comprise Gold, Platinum, or other materials with high thermal conductivity. In one embodiment, the shield structure is coated or galvanized with Gold, Platinum, or other metals with high thermal conductivity.

The thermal shield may comprise a continuous or coherent surface. In an alternative embodiment, the thermal shield may comprise or consist of a plurality of spaced shield elements. The thermal shield may further comprise one or more sections of coiled wire.

In an embodiment, the shield structure and/or the thermal shield are shaped in such a way to conform to a shape of the main magnet. For example, a surface contour of the thermal shield may imitate or conform to a surface contour of the main magnet.

In one embodiment, the thermal shield is cylindrical and arranged within a volume encompassed by a solenoidal coil of the main magnet. A cylinder axis of the thermal shield may be oriented in parallel to an axis of rotational symmetry defined by the solenoidal coil of the main magnet. However, at least a section of the shield structure and/or the thermal shield may also be arranged adjacent to the main magnet. In this case, an outer diameter of the ring-shaped thermal shield may exceed an inner diameter of the ring-shaped coil of the main magnet.

In an alternative embodiment, the shield structure comprises the shape of a disk or a prism. For example, a cross-section of the shield structure may be oval, rectangular, or polygonal. Such an arrangement of the shield structure may be suitable especially for open bore scanners, but also closed bore scanners.

In a further example, an imaginary envelope curve encompassing the main magnet comprises the shape of a hollow cylinder. In this case, the shield structure may be shaped as a cylinder, a ring, or a series of axially spaced rings. Depending on the shape and/or arrangement of the main magnet and/or a geometry of the magnetic resonance imaging device, the shield structure may have arbitrary shapes which may differ from a cylinder or ring shape described above.

As described above, the shield structure may comprise a thermal shield configured for reducing a transport of heat energy to the main magnet. The shield structure may be configured to reduce an influx of heat energy onto the main magnet from the patient bore of the magnetic resonance imaging device. The shield structure may also be configured to reduce thermal radiation onto the main magnet.

In one embodiment, the shield structure may comprise a solid thermal conductor for transporting heat energy from the shield structure to the cold head. In a "wet system", the shield structure may encompass a cryogen vessel enclosing at least the main magnet and a cryogen. It is conceivable that the shield structure provides a vacuumized gap in conjunction with other components of the cryostat, such as a wall of a vacuum chamber and/or a wall of the cryogen vessel, to reduce heat transport due to conduction and convection.

The shield structure may also comprise an electromagnetic shield configured to shield the main magnet from magnetic fields generated via the gradient system. A shielding effect of the shield structure may be based on absorption of electromagnetic fields in the shield elements. However, the shielding effect may also be based on reflection of electromagnetic radiation in an interfacial layer or boundary layer of a surface of the shield structure. The electromagnetic shield may comprise an electrically conductive material.

The thermal shield and the electromagnetic shield may be materially connected and/or form a single structure. In an embodiment, however, the thermal shield and the electromagnetic shield may be separate or spaced structures. It is conceivable that the thermal shield and/or the electromagnetic shield are mechanically supported by a further structure, such as the thermal bus structure and/or other components of the cryostat.

In one embodiment, the shield structure is structurally strong enough to bear forces generated during operation of the magnetic resonance imaging device and/or a magnet quench. For example, a material of the shield structure may provide enough mechanical support to reduce or minimize a movement and/or a deformation of the shield structure. The shield structure may be mechanically connected to the thermal bus structure and/or the at least one thermal bus element. Thus, a mechanical support of the shield structure may favorably be increased.

The main magnet comprises a magnet spacer configured for spacing individual coils of the main magnet. The magnet spacer may consist of a material which is capable of counteracting and/or resisting magnetic forces of the main magnet. The magnet spacer may be configured for maintaining a predefined positional relationship between separate coils of the main magnet. For example, the magnet spacer may comprise or consist of a cured resin, a metal, a metal alloy, a ceramic, a composite material, and the like. The magnet spacer may comprise an electrical insulation configured for preventing a transfer of electrical currents between coils of the main magnet separated via the magnet spacer.

The thermal bus structure comprises at least one thermal bus element extending through the magnet spacer for providing a thermal connection between the cold head of the cryocooler and the shield structure. The at least one thermal bus element extending through the magnet spacer may be a section of the thermal bus structure.

The magnet spacer may comprise a hole, a bore, a slot, or a cavity extending through a material of the magnet spacer. In a closed bore scanner, the at least one thermal bus element may pass through the hole, bore, or cavity in the magnet spacer and extend into a volume circumferentially encompassed by the main magnet. The hole or slot may separate the main magnet into two disjoint parts or halves. It is also conceivable that the at least one thermal bus element extends through a plurality of holes or slots distributed in regular or irregular intervals along the circumference of the main magnet.

In an embodiment, the at least one thermal bus element is thermally separated from the magnet spacer. For example, the at least one thermal bus element may extend through the magnet spacer without contacting the magnet spacer. However, the at least one thermal bus element and/or the magnet spacer may also comprise a thermally insulating material or layer arranged between the at least one thermal bus element and the magnet spacer. The thermally insulating material may be configured for reducing or preventing a heat exchange between the magnet spacer and the at least one thermal bus element. For example, a thermally insulating material may be made of carbon, carbon fiber, carbon, and/or glass fiber reinforced polymer, stainless steel (i. e. rods or thin-walled tubes), syntactic foam (with or without a filler), nested tubes or structures providing a long thermal heat transfer path in a compact structure, and the like.

By routing a section of the thermal bus structure through the magnet spacer, an average dimension or length of the thermal path around the superconducting magnet can advantageously be reduced in comparison to conventional magnetic resonance imaging devices. Thus, a heat transfer rate from the shield structure to the cold head may be increased. Furthermore, a reduction of an average length of a thermal path between the cold head and individual locations along the shield structure may favorably improve a time constant for the removal of heat energy from the shield structure.

The thermal bus structure may be characterized by a network formed by a plurality of thermal bus elements. The at least one thermal bus element or a plurality of thermal bus elements may be mechanically and thermally connected to a common structure, e.g. a thermal backbone. In one embodiment, the thermal bus structure is configured for providing mechanical support to one or more components of the magnetic resonance imaging device and/or one or more thermal bus elements.

The thermal bus structure may be made of thermally-conductive materials and/or non-thermally-conductive materials. Individual thermal bus elements may branch out from the thermal bus structure to provide a thermal connection with the shield structure and/or the cold head. The thermal bus structure and the at least one thermal bus element may be materially connected. In one embodiment, the thermal bus structure consists of one or more thermal bus elements thermally connecting the shield structure and a first stage of the cold head. However, the one or more thermal bus elements may also provide a thermal connection between a further component of the magnetic resonance imaging device and the cold head of the cryocooler.

In an embodiment, the at least one thermal bus element is mechanically and thermally connected to the thermal bus structure.

A thermal connection may be provided via a solder joint, a thermally conductive adhesive, a heat-conductive paste, a press-fitting, a screw connection, a bolted connection, or any other suitable mechanical connection. A thermal connection between the at least one thermal bus element and the shield structure may be implemented accordingly.

In providing a thermal bus structure, an average dimension or length of the cooling path between the shield structure and the cold head may be reduced. Thus, a rate of removal of heat energy may favorably be increased allowing for a wider selection of materials and/or designs of the shield structure to be used. For example, a material strength of the shield structure may favorably be reduced. Thus, a larger patient bore may be provided whilst keeping a wire cost of the main magnet constant. As a further option, a diameter of the main magnet may be reduced whilst keeping a diameter of the patient bore constant, thus reducing costs for the wire of the main magnet. Of course, a combination of the two concepts is also possible.

As a further advantage, less expensive materials with lower thermal conductivities and/or electrical conductivities may be used for the shield structure, thus allowing for cost savings during manufacture of the magnetic resonance imaging device.

An added mechanical support via the thermal bus structure may favorably increase a rigidity of the shield structure, but also other components of the magnetic resonance imaging device. Thus, a relative movement of components of the magnetic resonance imaging device may favorably be reduced or minimized and an image quality may be improved.

The at least one thermal bus provides a dedicated thermal path between the cold head and the shield structure. Thus, the thermal path can be favorably tuned for specific thermal requirements of the shield structure. For example, such specific thermal requirement may comprise short term transient heat loads of any suitable range, such as e.g. 10 W, between 5 W to 15 W, etc., and lasting for any suitable duration of time, such as e.g. 100 seconds, between 80 s and 120 s, etc.

According to an embodiment, the shield structure comprises an electromagnetic shield configured for providing an electromagnetic shielding of the main magnet from a magnetic field generated by the at least one gradient coil. The shield structure comprises a plurality of spaced shield elements and the thermal bus structure comprises a plurality of thermal bus elements, wherein the plurality of thermal bus elements provides a thermal connection between the plurality of spaced shield elements and the cold head of the cryocooler.

The plurality of thermal bus elements may provide a direct thermal connection between the cold head of the cryocooler and the plurality of spaced shield elements. A direct thermal connection may be characterized by a substantially straight and/or linear pathway between the cold head and a component of the magnetic resonance imaging device. It is also conceivable that a direct thermal connection is characterized by a particularly short or shortest possible thermal path between the cold head and the component of the magnetic resonance imaging device.

In one embodiment, the spaced shield elements are shaped as rings. An outer surface of the rings may conform to an inner surface of the imaginary envelope curve encompassing the main magnet as described above. The shield elements may be spaced apart in regular or irregular intervals along a cylindrical axis of the main magnet. The rings may be characterized by a substantially circular shape. Such an arrangement of the plurality of spaced shield elements is particularly suitable for closed bore scanners.

As the shield elements of the electromagnetic shield are spaced apart, stray fields from the gradient system may have an impact on the main magnet. However, the shield elements may be configured to decrease an impact of the stray field of the gradient system on the main magnet by at least 60%, at least 70% or at least 80%.

In one embodiment, the magnetic resonance imaging device is a closed bore scanner, and the main magnet comprises a plurality of axially spaced ring-shaped coils. In this case, the plurality of spaced shield elements may be arranged at intervals corresponding to the intervals of the axially spaced ring-shaped coils of the main magnet.

The spaced shield elements may be configured as concentric rings axially spaced along a cylindrical axis of the main magnet. A width of a ring-shaped shield element may correspond to a width of a ring-shaped coil of the main magnet at a corresponding axial location. However, the width of a ring-shaped shield element may also exceed or fall short of the width of a ring-shaped coil of the main magnet. In one embodiment, a distance between two ring elements may differ from a distance between two ring-shaped coils of the main magnet. It is also conceivable that a quantity of shield elements differs from a quantity of ring-shaped coils. In an embodiment, the quantity of shield elements corresponds to the quantity of ring-shaped coils of the main magnet.

It is conceivable that individual thermal bus elements form a bridge between the thermal bus structure and individual shield elements. However, individual thermal bus elements may also form a bridge between the cold head of the cryocooler and individual shield elements.

In one embodiment, the thermal bus elements form a part or a section of the spaced shield elements. Thus, the thermal bus elements may represent a portion or section of the shield elements. For example, the thermal bus structure may be thermally connected to the plurality of thermal bus elements forming parts or sections of the shield elements.

In a further embodiment, one or more thermal bus elements provide a thermal connection between two or more shield elements. For example, a thermal bus element may provide a thermal connection between a first shield structure and a second shield structure. Thus, the thermal bus elements may be configured for transporting heat energy between the first shield structure and the second shield structure.

In providing a thermal bus structure comprising a plurality of thermal bus elements providing a thermal connection between the plurality of spaced shield elements and the cold head of the cryocooler, material expenses and/or a weight of the magnetic resonance imaging device can favorably be reduced.

According to a further embodiment, the thermal bus structure comprises an intermediate support structure arranged between the main magnet and an outer shield coil. The intermediate support structure may represent a part of the thermal bus structure and/or act as a thermal backbone as described above. For this purpose, the intermediate support structure may comprise thermally conductive materials, such as Aluminum, Copper, but also stainless steel, glass fiber reinforced polymers, and/or carbon fiber reinforced polymers.

At least a section of the intermediate support structure may be cylindrical in shape. For instance, the intermediate support structure may correspond to an intermediate support cylinder.

It is conceivable that the intermediate support cylinder is thermally connected to the cold head of the cryocooler via one or more thermal bus elements. Thus, an average length of a thermal path between the cold head and the shield structure can be reduced.

In a further embodiment, the intermediate support structure provides mechanical support to components of the magnetic resonance imaging device, such as the main magnet, the outer shield, the gradient system, and/or the at least one thermal bus element.

An outer shield may represent an electromagnetic shield configured for shielding the magnetic resonance imaging device from external electromagnetic radiation and/or reduce an impact of electromagnetic interference from external sources. However, the outer shield coil may also be configured to constrain an extension of the magnetic field provided via the main magnet.

The intermediate support structure may favorably provide mechanical support to components of the magnetic resonance device and thus compensate for a lack of an equivalent structure in "dry systems" without a cryogen vessel.

Furthermore, "dry systems" are typically associated with relatively poor cooling of the magnet as well as other components of the field generation unit. Thus, implementing the intermediate support cylinder as a part of the thermal bus structure and/or thermally connecting it to the at least one thermal bus element may favorably relieve or resolve limitations regarding a cooldown time of the magnet after warm shipping to site, recovery after a quench or warm up due to loss of cooling.

In providing an intermediate support structure comprising thermally conductive materials, an average length of the thermal path between the cold head and the shield structure can be reduced. Thus, a cool down of a "dry system" can favorably be accelerated.

In one embodiment, the main magnet is encompassed by or wrapped in a heat-insulating layer. An inner surface of a hole in the magnet spacer for providing a passageway for the at least one thermal bus element is covered by the heat-insulating layer to reduce a heat exchange between the magnet spacer and the at least one thermal bus element.

The hole in the magnet spacer may provide a passageway from a first side of the main magnet to a second side of the main magnet. For example, the first side corresponds to an outer surface or circumference of a solenoidal main magnet, whereas the second side corresponds to an inner surface or an inner circumference of the solenoidal main magnet. The hole may have an arbitrary cross-sectional shape. For example, the cross-sectional shape of the hole may be oval or polygonal or an arbitrary combination thereof.

In one embodiment, the main magnet may be sealed or wrapped within the heat-insulating layer. Thus, a conventional cryogen vessel can favorably be omitted. For example, the heat-insulating layer encompassing the main magnet may replace a conventional cryogen vessel in a "dry system".

The heat-insulating layer may consist of a wrapping of aluminized mylar. However, the heat-insulating layer may also consist of a multilayer insulation comprising one or more non-thermally conductive materials or material compositions. It is conceivable that the material or material composition of the heat-insulating layer has a low thermal emissivity to reduce thermal radiation in the direction of the main magnet.

In one embodiment, a cross-sectional area of the hole in the magnet spacer is oversized with respect to a cross-sectional area of the at least one thermal bus element extending through the hole in the magnet spacer. Thus, a physical contact between the heat-insulating layer and the at least one thermal bus element can be avoided. It is also conceivable, however, that the at least one thermal bus element and the heat-insulating layer have a physical contact along the inner surface of the hole in the magnet spacer.

In providing a heat-insulating layer along the inner surface of the hole or cavity in the magnet spacer, a heat exchange between the at least one thermal bus element and the main magnet can favorably be reduced or minimized.

According to a further embodiment, the shield structure forms a part of a cryostat encompassing the main magnet, wherein the at least one thermal bus element extends through a cryogen vessel of the cryostat for providing a thermal connection between at least a first inner surface and a second inner surface of the shield structure.

In an embodiment, the first inner surface of the shield structure differs from the second inner surface. The first inner surface may be mechanically connected to the second inner surface, but oriented in a different plane and/or at an angle with respect to the second inner surface. For example, the first inner surface and the second inner surface may relate to opposing walls of a double walled hollow cylinder encompassing the imaging region of the magnetic resonance imaging device.

It is conceivable that the shield structure encompasses the main magnet or both the main magnet and the outer shield coil. In case of a "wet system", the shield structure may also encompass a cryogen vessel containing a cryogen for cooling the magnet. The shield structure may be enclosed in a gas-tight inner volume of a vacuum chamber.

In an embodiment, the magnetic resonance imaging device is a closed-bore scanner comprising a solenoidal main magnet. The shield structure may be implemented as a double-walled hollow cylinder enclosing an inner volume that corresponds to the imaging region or a patient bore of the magnetic resonance imaging device. The first surface of the shield structure may relate to an outer wall confining the main magnet in a direction facing away from the imaging region. The second surface may relate to an inner wall of the shield structure confining the main magnet in a direction facing towards the imaging region. Thus, the first surface and the second surface may relate to two opposing walls of the shield structure encompassing at least the magnet of the magnetic resonance imaging system.

It is also conceivable that the first surface is oriented at an angle with respect to the second surface. For example, the angle between the first surface and the second surface may range between any suitable angles such as e.g. between 10° and 170°, between 60° and 120°, etc. In one embodiment, the angle is about 90°. In this case, the second surface may be a side wall of the shield structure confining the main magnet in an axial direction.

A thermal bus element thermally connecting a first surface and a second surface of the shield structure may provide an easy to implement and/or cost-effective way of reducing an average length of the thermal path between the cold head and the shield structure.

In an embodiment, the shield structure forms a part of a cryostat encompassing the main magnet, wherein at least one thermal bus element is configured to provide a direct thermal connection between at least one surface of the shield structure and the cold head of the cryocooler, and wherein the at least one surface of the shield structure is dissimilar to a surface of the shield structure mounting the cold head.

A surface of the shield structure mounting the cold head may relate to a wall of the shield structure to which the cold head is directly attached. In one embodiment, the surface of the shield structure mounting the cold head may carry the cold head. The surface of the shield structure mounting the cold head may also comprise a seal and/or a gasket configured to prevent air and/or gas from entering an interior volume of the shield structure. The at least one surface of the shield structure may differ from the surface of the shield structure mounting the cold head. The at least one surface of the shield structure may be mechanically connected to the surface of the shield structure mounting the cold head, but oriented in a different plane and/or at an angle with respect to the surface of the shield structure mounting the cold head. For example, the at least one surface of the shield structure and the surface of the shield structure mounting the cold head may relate to opposing walls of a double walled hollow cylinder encompassing the imaging region of the magnetic resonance imaging device.

In one embodiment, a plurality of thermal bus elements provide a thermal connection between the cold head and at least one surface dissimilar to the surface of the shield structure mounting the cold head.

As described above, the shield structure may be implemented as a double walled hollow cylinder. The main magnet may be encompassed between an outer wall that corresponds to an outer circumference of the hollow cylinder and an inner wall that corresponds to an inner bore tube of the magnetic resonance imaging device. The cold head may be mounted to the outer wall of the shield structure, whereas the at least one thermal bus element provides a thermal connection between the cold head and the inner wall of the shield structure. It is also conceivable, that the at least one thermal bus element provides a thermal connection between the cold head and a side wall of the shield structure confining the main magnet in an axial direction. The side wall may be oriented at an angle of substantially 90° with respect to the outer wall of the shield structure. The outer wall, the inner wall, and the side wall of the shield structure may encompass a vacuumized interior volume for reducing thermal radiation in the direction of the magnet. In one embodiment, the vacuumized interior volume may be a dedicated cryogen vessel encompassing at least the magnet.

In an embodiment, the at least one thermal bus element provides a thermal connection between the first stage of the cold head and the at least one surface of the shield structure. Of course, the thermal bus structure may comprise further thermal bus elements configured to provide a thermal connection between two or more components of the magnetic resonance imaging device according to an embodiment described herein.

The at least one thermal bus element may correspond to a first thermal bus element extending through the hole in the magnet spacer as described above. However, the at least one thermal bus element may also represent a second thermal bus element or a third thermal bus element, dissimilar to the first thermal bus element.

Thermally connecting at least one surface of the shield structure and the cold head of the cryocooler via at least one thermal bus element may provide a cost-effective solution for reducing an average length of the thermal path between the cold head and the shield structure.

According to a further embodiment, the thermal bus structure comprises a first thermal bus element configured for providing a direct thermal connection between a first stage of the cold head and the shield structure and a second thermal bus element configured for providing a direct thermal connection between a second stage of the cold head and the main magnet. A first temperature level of the first stage of the cold head exceeds a second temperature level of the second stage of the cold head.

The first stage of the cold head may be characterized by a temperature level in any suitable range such as e.g. between 30 and 90 K, between 40 and 60 K, etc. The second stage of the cold head may be characterized by a temperature level below the superconducting temperature of the main magnet. For example, the second stage may provide a temperature level in any suitable range such as e.g. a range between 2 and 20 K, between 3 and 8 K, etc.

Thermally connecting the shield structure to the first stage of the cold head may be advantageous for reducing thermal radiation onto the magnet.

According to an embodiment, the magnetic resonance imaging device further comprises a buffer unit configured for providing and/or receiving heat energy, wherein at least one thermal bus element provides a thermal connection between the buffer unit and the cold head of the cryocooler.

The buffer unit may be configured for storing a cryogen at a low temperature level. However, the buffer unit may also comprise a solid or liquid heat storage medium.

The cryogen may be any suitable fluid, e.g. selected from the cryogens mentioned above. However, the cryogen may also comprise a mixture of liquid and solid cryogens, such as a mixture of liquid Neon and solid Nitrogen or a mixture of solid Argon and liquid Nitrogen, and the like.

The buffer unit may be thermally connected to the first stage of the cold head to adjust the temperature of the cryogen stored within the buffer unit. Thus, the buffer unit may be regenerated, i. e. by cooling, solidifying, or condensing the cryogen—depending on the desired phase state and/or temperature. The thermal connection between the buffer unit and the cold head may be implemented according to an embodiment described above. It is conceivable that the cryogen stored within the buffer unit is frozen or solid. However, the buffer unit may also comprise liquid cryogen or a liquid fraction of cryogen or even a gaseous fraction of cryogen.

A buffer unit according to the disclosure may favorably be used for increasing a thermal capacity of the thermal bus structure and/or the shield structure. The buffer unit may be positioned in proximity to the thermal bus structure, the at least one thermal bus element, and/or the shield structure. Thus, the thermal capacity of the thermal bus structure and/or the shield structure can favorably be increased while avoiding increasing an amount of highly specialized and/or expensive materials used for the shield structure. Furthermore, the added thermal capacity provided via the buffer unit may favorably mitigate or minimize temperature variations within the shield structure, thus increasing the image quality of the magnetic resonance imaging device.

As a further advantage, the additional buffer unit allows higher heat loads to be absorbed, thus enabling the use of unshielded or partly shielded gradient coils. This may allow for a simplification of a magnet design, a reduction in weight, and/or an increase of a diameter of the patient bore of the magnetic resonance imaging device.

In one embodiment, a section of the shield structure comprises a plurality of concentric, axially spaced rings mechanically connected via a plurality of struts oriented in parallel to a cylinder axis defined by the plurality of axially spaced rings.

The section of the shield structure may correspond to the thermal shield. The thermal shield may be implemented as a "bird cage." The struts connecting the plurality of concentric, axially spaced rings may be implemented as stainless steel bars or rods. One or more struts may be thermally connected to the first stage of the cold head via the at least one thermal bus element.

The concentric, axially spaced rings may comprise thermally conductive but non-electrically conductive materials. In an embodiment, the rings may consist of glass fiber reinforced polymers or carbon fiber reinforced polymers. The section of the shield structure or the thermal shield may be covered or wrapped in a heat-insulating layer according to an embodiment described above. Thus, thermal radiation from the shield structure may favorably be reduced or minimized. The concentric, axially spaced rings and/or struts may be configured to provide mechanical support to the heat-insulating layer, but also an electromagnetic shield, a plurality of shield elements according to an embodiment described above and/or the main magnet.

The struts may be characterized by a cylindrical shape with a diameter within any suitable range of values such as e.g. in a range of 1 mm to 7 mm, 2 mm to 6 mm, 3 mm to 5 mm, etc. In an embodiment, the struts have an oval cross section with a mean diameter of about 3 mm. However, the struts may comprise arbitrary profiles or cross sections with equivalent cross-sectional areas.

In one embodiment, the shield structure comprising the plurality of concentric, axially spaced rings mechanically connected via the plurality of struts may be covered or wrapped in a layer of aluminized mylar or a similar material. It is conceivable that such a shield structure provides an electromagnetic shielding of the main magnet.

In providing the shield structure, a radial dimension and/or a weight of the shield structure may favorably be reduced while maintaining a low thermal emissivity and an acceptable rate of heat removal via the at least one thermal bus element. The at least one thermal bus element thermally connecting the cold head and the shield structure may be instrumental in providing a shield structure according to the disclosure.

As a further advantage, the size of the patient bore may be increased without compromising or with minimal comprises regarding the image quality of the magnetic resonance imaging device.

According to a further embodiment, the plurality of thermal bus elements and/or the shield structure are configured for providing mechanical support to the plurality of spaced shield elements.

As described above, the shield structure may comprise a thermal shield and an electromagnetic shield. The thermal shield may represent a bore tube of the magnetic resonance imaging device. In an embodiment, the electromagnetic shield may be mounted to or carried by the thermal shield. The plurality of spaced shield elements may be mechanically connected to the thermal shield via a material bond, a frictional connection, and/or a form-locking connection. For example, the plurality of shield elements may be clamped, bolted, screwed and/or glued to the thermal shield element.

In an embodiment, the plurality of spaced shield elements may be clamped to the thermal shield via a bolt or screw and a supporting element. A clamping force exerted via the bolt or screw and the supporting element may be used for an individualized tuning of the heat exchange between the thermal shield and individual shield elements. Heat energy from the electromagnetic shield may be transferred to the thermal shield thermally connected to the cold head via the at least one thermal bus element.

In another embodiment, the plurality of thermal bus elements is thermally connected to the plurality of spaced shield elements and provides mechanical support to the plurality of spaced shield elements. The plurality of thermal bus elements provides a direct thermal connection between the plurality of spaced shield elements and the cold head of the cryocooler. However, one or more thermal bus elements may also be mechanically connected and/or thermally connected to the thermal shield. Thus, one or more shield elements may be mechanically and thermally connected to the thermal bus structure as well as the thermal shield.

In providing an electromagnetic shield mechanically and thermally connected to the thermal bus structure and/or the thermal shield, an average length of the thermal path between the cold head and the electromagnetic shield may favorably be reduced in comparison to conventional magnetic resonance imaging devices. Thus, the reliability and/or efficiency of heat removal may be increased.

According to an embodiment, the at least one thermal bus element comprises a solid thermal conductor and/or a heat pipe. The at least one thermal bus element may consist of a solid thermal conductor. A material of the solid thermal conductor may correspond to a material of the shield structure or a material of the thermal bus structure according to an embodiment described above. For example, the thermal bus element may be made of Aluminum or Copper. It is also conceivable that non-electrically conducting materials are used, such as carbon, ceramics and/or composite materials.

The at least one thermal bus element may be implemented as a braid, a mesh, a mesh-wire, a rod, a plate, a laminate, or the like. It is conceivable that the at least one thermal bus element comprises a complex three-dimensional shape. For example, the at least one thermal bus element may comprise one or more bends, angles, or arcs in one or more spatial directions. However, at least one thermal bus element may comprise an essentially linear extension, thus providing a direct thermal connection between two components of the magnetic resonance imaging device.

In using a solid thermal conductor, a durability of the thermal bus structure and/or a mechanical support provided by the thermal bus structure may favorably be increased.

The at least one thermal bus element may also comprise or consist of a heat pipe. A heat pipe may comprise a working fluid sealed in a tube which is closed at both ends. The heat pipe may be configured to absorb heat energy at a first end of the tube, causing the working fluid to evaporate and transport the heat energy to a second end of the tube, where the working fluid condenses. Temperature and pressure differences between the first end and the second end of the tube may accelerate heat transport within the tube and surpass conventional heat conduction in a solid material significantly. Examples for suitable working fluids are Helium, Argon, Neon, Nitrogen, or the like.

It is also conceivable that the at least one thermal element comprises solid Nitrogen embedded or enclosed in a solid thermal conductor. Nitrogen has a melting point of about 63 K at 1 atmosphere, whereas a temperature of the thermal bus structure may be within a range of e.g. between 40 to 60 K. It is conceivable that the solid Nitrogen acts as a phase change material configured for absorbing high amounts of heat energy when melting whilst maintaining a temperature level within a range of a few Kelvin.

In providing one or more thermal bus elements comprising solid Nitrogen, the thermal capacity of the thermal bus structure may favorably be increased. Thus, the thermal bus structure may act as a thermal buffer, mitigating or minimizing an impact of high heat loads.

According to a further embodiment, the thermal bus structure is configured to provide mechanical support to at least a section of the shield structure.

In one embodiment, the thermal bus structure may replace a mechanical support provided via a component of the cryostat, such as the cryogen vessel. Thus, the cryostat can favorably be omitted in a "dry system".

The thermal bus structure may be configured to provide mechanical support to the thermal shield and/or the electromagnetic shield of the shield structure. For this purpose, a material, a material strength, and/or an arrangement of the thermal bus structure may be configured for bearing the weight of the thermal shield and/or the electromagnetic shield. The thermal bus structure may be configured for bearing magnetic forces acting on the thermal shield and/or the electromagnetic shield during an operation of the magnetic resonance imaging device, but also during a quench.

The thermal connection between the thermal bus structure and the section of the shield structure may be implemented according to an embodiment described above. In an embodiment, the thermal connection between the thermal bus structure and the thermal shield and/or the electromagnetic shield also comprises a mechanical connection capable of bearing the above mentioned magnetic and gravitational forces.

According to an embodiment, the thermal bus structure comprises at least one thermal bus element, e.g. a plurality of thermal bus elements arranged at a non-perpendicular angle with respect to an orientation of a main magnetic field within an imaging region of the magnetic resonance imaging device.

The orientation of the main magnetic field within the imaging region may correspond to the Z-direction as conventionally used in magnetic resonance tomography. It is also conceivable that the orientation of the main magnetic field corresponds to a direction of patient access to the imaging region of the magnetic resonance imaging device. The orientation of the main magnetic field within the imaging region may also be oriented in parallel to an axis of rotational symmetry of a cylindrical bore of a closed-bore scanner.

In an embodiment, one or more thermal bus elements have an essentially linear extension. Thus, the one or more thermal bus elements may be substantially straight and/or provide a direct thermal connection between the cold head and the shield structure and/or another component of the field generation unit. Of course, the magnetic resonance imaging device may comprise further thermal bus elements according to an embodiment described herein not affected by this limitation.

Arranging at least one thermal bus element at a non-perpendicular angle with respect to the orientation of the main magnetic field within the imaging region may provide a cost-effective way of increasing mechanical stability of the thermal bus structure in several translational and rotational directions.

In providing a thermal bus structure configured to provide mechanical support to at least a section of the shield structure, the tasks of removing heat energy from the shield structure and providing mechanical support to a field generating unit of the magnetic resonance imaging device may favorably be combined in one component. Thus, a more compact and/or light-weight mechanical design of the field generation unit may be achieved.

In a further embodiment, the at least one thermal bus element and/or the plurality of thermal bus elements are arranged at non-perpendicular angles with respect to a second direction. The second direction is oriented orthogonally to the orientation of the main magnetic field in the imaging region and in parallel to a plane defined by a supporting surface of a patient support configured for supporting a patient during a magnetic resonance examination.

For example, the patient support device may be a patient couch or a patient table. The plane defined by the supporting surface of the patient support may be oriented substantially in parallel to a floor of an examination room accommodating the magnetic resonance imaging device. However, in some magnetic resonance imaging devices, the patient support may also be oriented at a non-zero angle with respect to the floor of the examination room.

In one embodiment, the at least one thermal bus element and/or the plurality of thermal bus elements are arranged at non-perpendicular angles with respect to a third direction, wherein the third direction is oriented orthogonally to the orientation of the main magnetic field within the imaging region and the second direction.

The second direction may correspond to an X-direction as conventionally used in magnetic resonance tomography. Accordingly, the third direction may correspond to a Y-direction as conventionally used in magnetic resonance tomography.

Arranging the thermal bus elements at non-perpendicular angles with respect to the Z-direction and the X-direction of the magnetic resonance imaging device may favorably increase the mechanical stability of the thermal bus structure along a plurality of spatial directions, i. e. translational and rotational directions related to the cylindrical bore of a closed-bore scanner.

In one embodiment, at least two thermal bus elements of the plurality of thermal bus elements comprise different heat transfer properties for providing an individualized temperature control of at least two spaced shield elements.

A heat transfer property of a thermal bus element may be characterized by a thermal conductivity, a thermal resistance, a thermal insulance, a heat transfer coefficient, a material, a material composition, a shape and/or a temperature of the bus element. The heat transfer property of the thermal bus element may depend on a temperature as well as a material, a shape and/or mechanical configuration of the thermal bus element.

According to an embodiment, a first heat transfer property of a first thermal bus element thermally connected to a first shield element differs from a second heat transfer property of a second thermal bus element thermally connected to a second shield element. For example, a shape of the first thermal bus element differs from a shape of the second thermal bus element to compensate for different heat loads expected in the first shield element and the second shield element. In a further example, a first cross-sectional area of a first thermal bus element may exceed a second cross-sectional area of a second thermal bus element to decrease the thermal resistance and/or increase the heat transfer coefficient of the first thermal bus element with respect to the second thermal bus element.

The thermal bus structure may be designed in such a way that shield elements which are subject to higher heat loads are thermally connected to thermal bus elements with lower thermal resistances. Thus, differing heat loads across the shield elements can favorably be pre-compensated by statically setting heat transfer properties of the respective thermal bus elements, for example by choosing individual shapes and/or material compositions.

In one embodiment, a third heat transfer property of a third thermal bus element thermally connected to a third shield element differs from the first heat transfer property of the first thermal bus element and/or the second heat transfer property of the second thermal bus element. It is conceivable that the thermal bus structure comprises a plurality of thermal bus elements with different heat transfer properties.

In an embodiment, each thermal bus element of the plurality of thermal bus elements comprises different heat transfer properties to provide an individualized temperature control of the plurality of spaced shield elements. For instance, the thermal resistance of each individual thermal bus element may be tailored to compensate for a typical or an expected heat load distribution. For example, a typical or expected heat load distribution may comprise averaged heat loads over one or more imaging sequences and/or slice orientations.

In providing a plurality of thermal bus elements with different heat transfer properties, an individualized temperature control of the plurality of spaced shield elements may be provided. Thus, eddy currents within the plurality of spaced shield elements may be equalized or harmonized in such a way, that an occurrence of dissimilar or varying eddy fields superimposing in an imaging region may be impeded or prevented.

By equalizing eddy currents within the plurality of spaced shield elements, results of conventional eddy current compensation methods may advantageously be improved. Thus, an occurrence of image artifacts may be moderated or prevented and a quality of acquired magnetic resonance images may favorably be improved.

BRIEF DESCRIPTION OF THE DRAWINGS

Further advantages and details of the present disclosure may be recognized from the embodiments described below as well as the drawings. The figures show:

FIG. 5 illustrates a schematic representation of a thermal bus element extending through a main magnet of the example magnetic resonance imaging device;

FIG. 6 illustrates a schematic representation of an embodiment of an example magnetic resonance imaging device;

DETAILED DESCRIPTION OF THE DISCLOSURE

Figure 1:
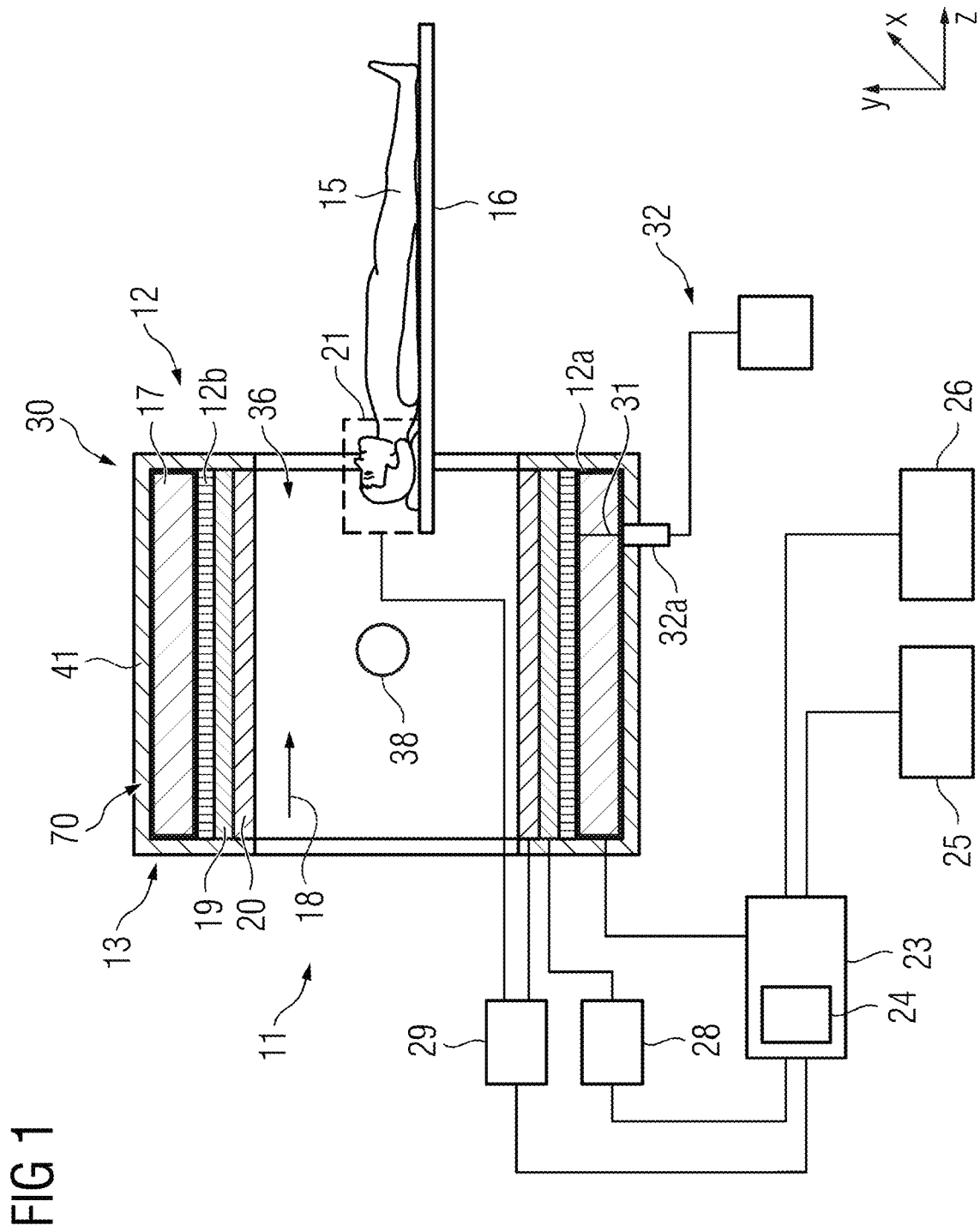
FIG. 1 illustrates a schematic representation of an embodiment of an example magnetic resonance imaging device.

FIG. 1 shows an embodiment of a magnetic resonance imaging device 11 according to the disclosure. The magnetic resonance imaging device 11 comprises a magnetic resonance imaging device 11 with a static field magnet 17 that provides a homogenous, static magnetic field 18 (B0 field). The static magnetic field 18 comprises an isocenter 38 and permeates a cylindrical imaging region 36 for receiving an imaging object, such as a patient 15. The imaging region 36 may defined by a patient bore configured for accommodating a patient during a magnetic resonance measurement. The imaging region 36 is surrounded by the field generation unit 30 in a circumferential direction.

In the depicted example, the magnetic resonance imaging device 11 comprises a patient support 16 configured to transport the patient 15 into the imaging region 36. The patient support 16 may transport a diagnostically relevant region of the patient 15 into an imaging volume defined by the isocenter 38 of the magnetic resonance imaging device 11. The field generation unit 30 of the magnetic resonance imaging device 11 may be screened from an environment by a housing shell 41.

The magnetic resonance imaging device 11 further comprises a gradient system 19 configured to provide magnetic gradient fields used for spatial encoding of magnetic resonance signals acquired during a magnetic resonance measurement. The gradient system 19 is activated or controlled by a gradient controller 28 via an appropriate current signal. It is conceivable that the gradient system 19 comprises one or more gradient coils for generating magnetic gradient fields in different, e.g. orthogonally oriented, spatial directions.

In the embodiment shown in FIG. 1, at least a section of the shield structure 12 is arranged between the gradient system 19 and the main magnet 17. The shield structure 12 may comprise a thermal shield 12a and an electromagnetic shield 12b. The thermal shield 12a is configured for reducing a transport of heat energy to the main magnet 17. The thermal shield 12a may also be configured for screening the main magnet 17 from thermal radiation. The electromagnetic shield 12b may be configured for shielding the main magnet 17 from magnetic gradient fields provided by the one or more gradient coils of the gradient system 19.

The magnetic resonance imaging device 11 may comprise a radiofrequency antenna 20 (body coil), which may be integrated into the magnetic resonance imaging device 11. The radiofrequency antenna 20 is operated via a radiofrequency controller 29 that controls the radiofrequency antenna 20 to generate a high frequency magnetic field and emit radiofrequency excitation pulses into the imaging region 36. The magnetic resonance imaging device 11 may further comprise a local coil 21, which is positioned on or in proximity to the diagnostically relevant region of the patient 15. The local coil 21 may be configured to emit radiofrequency excitation pulses into the patient 15 and/or receive magnetic resonance signals from the patient 15. It is conceivable, that the local coil 21 is controlled via the radiofrequency controller 29.

The magnetic resonance imaging device 11 further comprises a control unit 23 configured for controlling the magnetic resonance imaging device 11. The control unit 23 may comprise a processing unit 24 configured to process magnetic resonance signals and reconstruct magnetic resonance images. The processing unit 24 may also be configured to process input from a user of the magnetic resonance imaging device 11 and/or provide an output to a user. For this purpose, the processing unit 24 and/or the control unit 23 can be connected to a display unit 25 and an input unit 26 via a suitable signal connection. For a preparation of a magnetic resonance imaging measurement, preparatory information, such as imaging parameters or patient information, can be provided to the user via the display unit 25. The input unit 26 may be configured to receive information and/or imaging parameters from the user.

The magnetic resonance imaging device 11 further comprises a cryocooler 32 configured to cool the main magnet 17, the thermal shield 12a, the electromagnetic shield 12b, but also other components of the field generation unit 30. The cryocooler 32 may comprise a compressor supplying pressurized gas to the cryocooler 32. According to the embodiment shown in FIG. 1, the cryocooler 32 includes a cold head 32a comprising one or more cooling stages (not shown). A first stage of the cold head 32a may be thermally connected to the thermal bus structure 31 (see Figs. below), while a second stage of the cold head 32a may be thermally connected to the main magnet 17. In an alternative embodiment, the thermal bus structure 31 and the main magnet 17 may be thermally connected to the same stage of the cold head 32a.

Of course, the magnetic resonance imaging device 11 may comprise further components that magnetic resonance imaging devices usually offer. The general operation of a magnetic resonance imaging device 11 is known to those skilled in the art, so a more detailed description is omitted.

Figure 2:
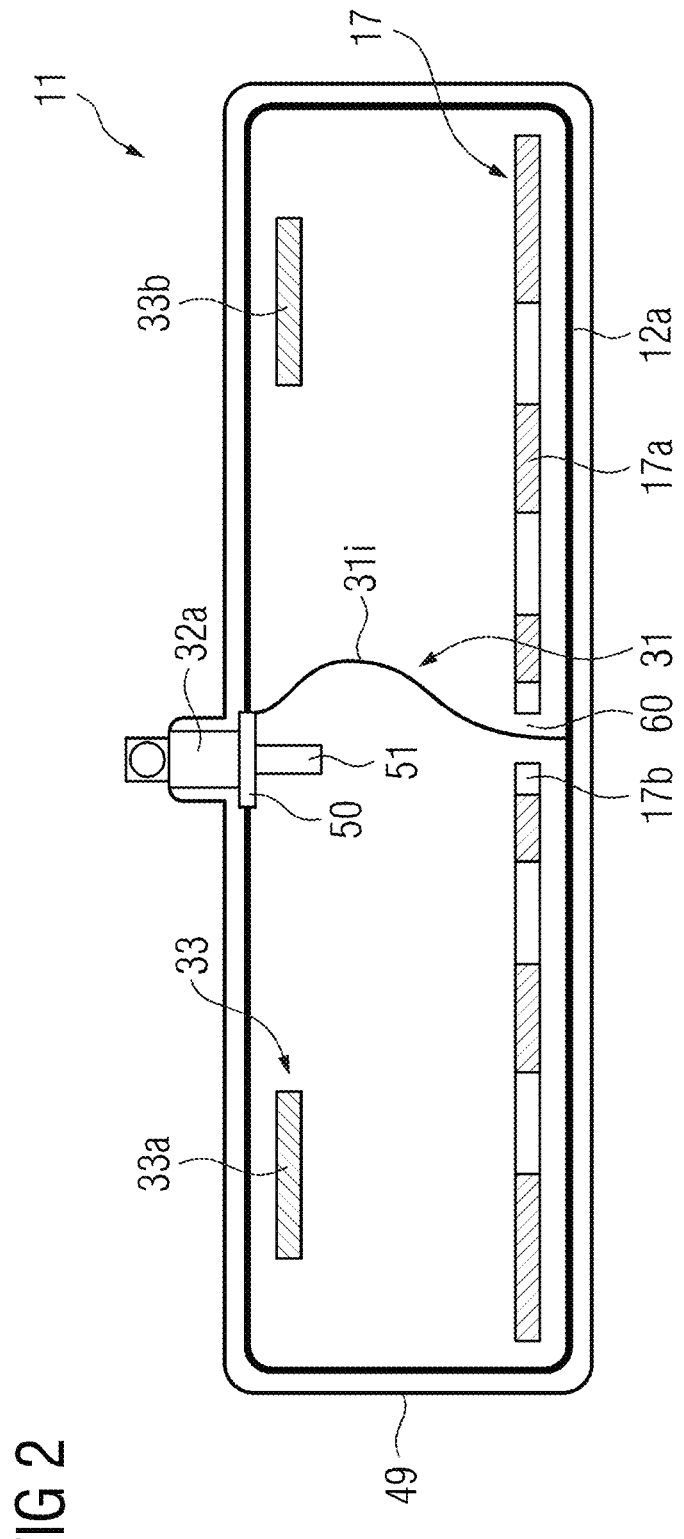
FIG. 2 illustrates a schematic representation of an embodiment of an example magnetic resonance imaging device.

FIG. 2 shows an embodiment of the magnetic resonance imaging device 11 comprising a thermal bus element 31i thermally connecting the first stage 50 of the cold head 32a and the thermal shield 12a. In the depicted embodiment, the thermal bus element 31i is implemented as a braid or a wire mesh made from a material with high thermal conductivity, such as Aluminum or Copper. The thermal bus element 31i extends through a hole 60 in the magnet spacer 17b to provide a short thermal path between the cold head 32a and the thermal shield 12a. Of course, the magnetic resonance imaging device 11 may comprise a plurality of thermal bus elements 31i providing a thermal connection between the cold head and the thermal shield 12a.

In the example shown in FIG. 2, the thermal shield 12a is encompassed by a vacuum chamber 49. The thermal shield 12a in turn encompasses the main magnet 17 and the outer shield 33 including the outer shield coils 33a and 33b. The outer shield 33 is configured for pulling in a magnetic stray field of the magnet 17.

If the magnetic resonance imaging device 11 is implemented as a "wet system", the thermal shield 12a may encompass a cryogen vessel 40 (see FIG. 3) including a cryogen. However, particularly in a "dry system", the cryogen vessel 40 may be omitted. In a "dry system", the magnet 17 may be cooled substantially or exclusively via thermal conduction along the thermal bus structure 31.

The thermal bus element 31i provides a direct thermal connection between the cold head 32 and a surface of the thermal shield 12a dissimilar to the surface of the thermal shield 12a mounting the cold head 32a. For example, the surface of the thermal shield 12a dissimilar to the surface of the thermal shield 12a mounting the cold head 32a may correspond to a wall of the thermal shield 12a separating the magnet 17 from the imaging region 36 (see FIG. 3). The surface of the thermal shield 12a dissimilar to the surface of the thermal shield 12a mounting the cold head 32a may also correspond to a side wall of the thermal shield 12a oriented at an angle of approximately 90° with respect to the surface of the thermal shield 12a mounting the cold head 32a.

Figure 3:
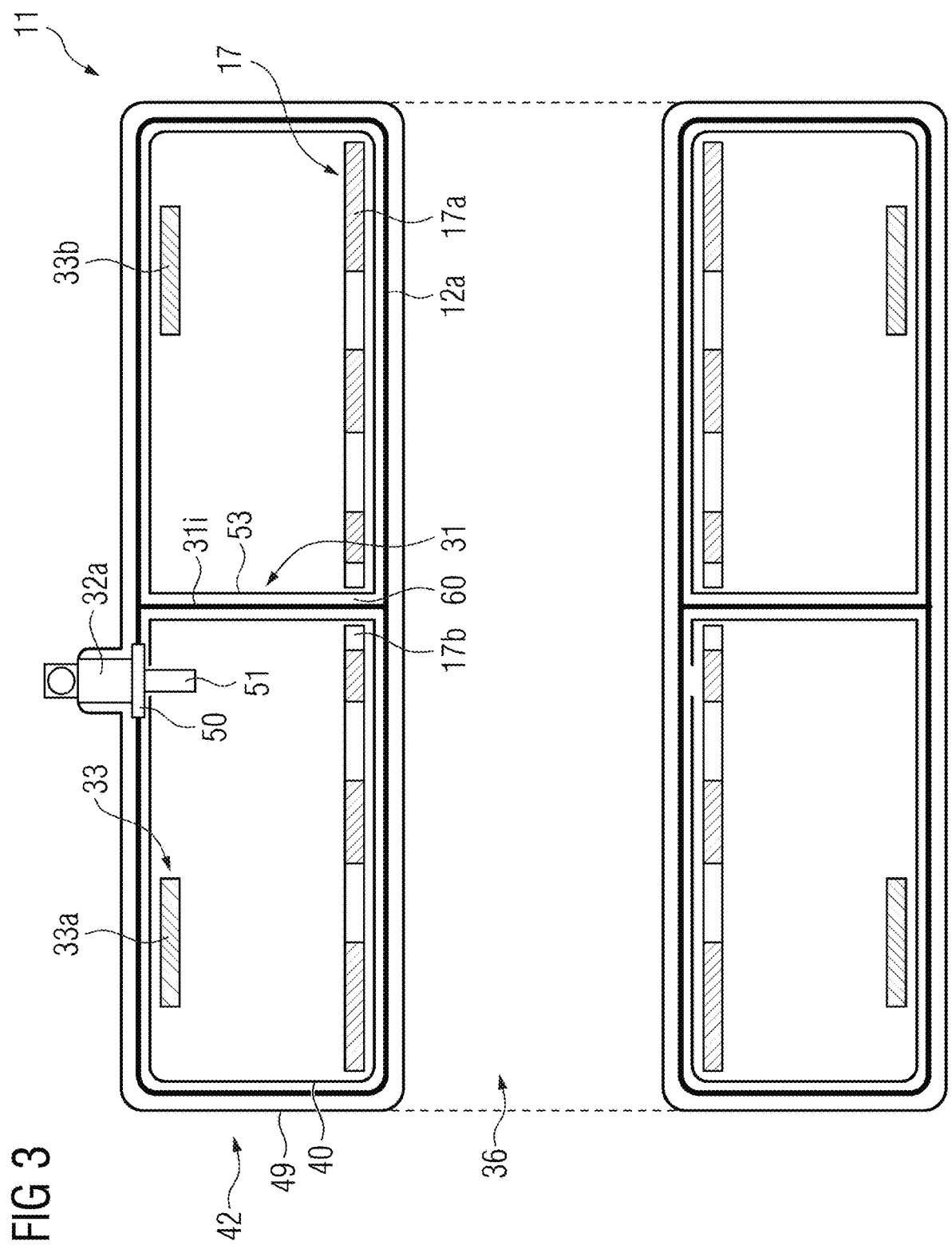
FIG. 3 illustrates a schematic representation of an embodiment of an example magnetic resonance imaging device.

FIG. 3 shows a further embodiment of the magnetic resonance imaging device 11 comprising a thermal bus element 31i thermally connecting the first stage 50 of the cold head 32a and the thermal shield 12a. In contrast to the embodiment shown in FIG. 2, the thermal bus element 31i comprises a ring encompassing the imaging region 36 along a circumferential direction. In this case, the hole 60 in the magnet spacer 17b may be a slot, separating the main magnet into two disjoint parts or halves. It is also conceivable that the thermal bus element 31i extends through one or more holes 60 distributed in regular or irregular intervals along the circumference of the main magnet 17.

A thermal bus element 31i according to the embodiment shown in FIG. 3 may provide increased mechanical support to the thermal structure 12a, but also the main magnet 17 and/or other components of the magnetic resonance imaging device 11.

In the depicted example, the magnetic resonance imaging device 11 is configured as a "wet system" comprising a cryogen vessel 40 enclosing a cryogen (not shown), the main magnet 17 and the outer shield 33. The cryogen vessel 40 may comprise one or more tubes or conducts 53 configured for feeding the thermal bus element 31i through the cryogen vessel 40 and the magnet spacer 17b. Thus, at least one thermal bus element 31i may pass through a volume usually occupied by the cryogen vessel 40 while still providing a sealed cryogen enclosure.

Figure 4:
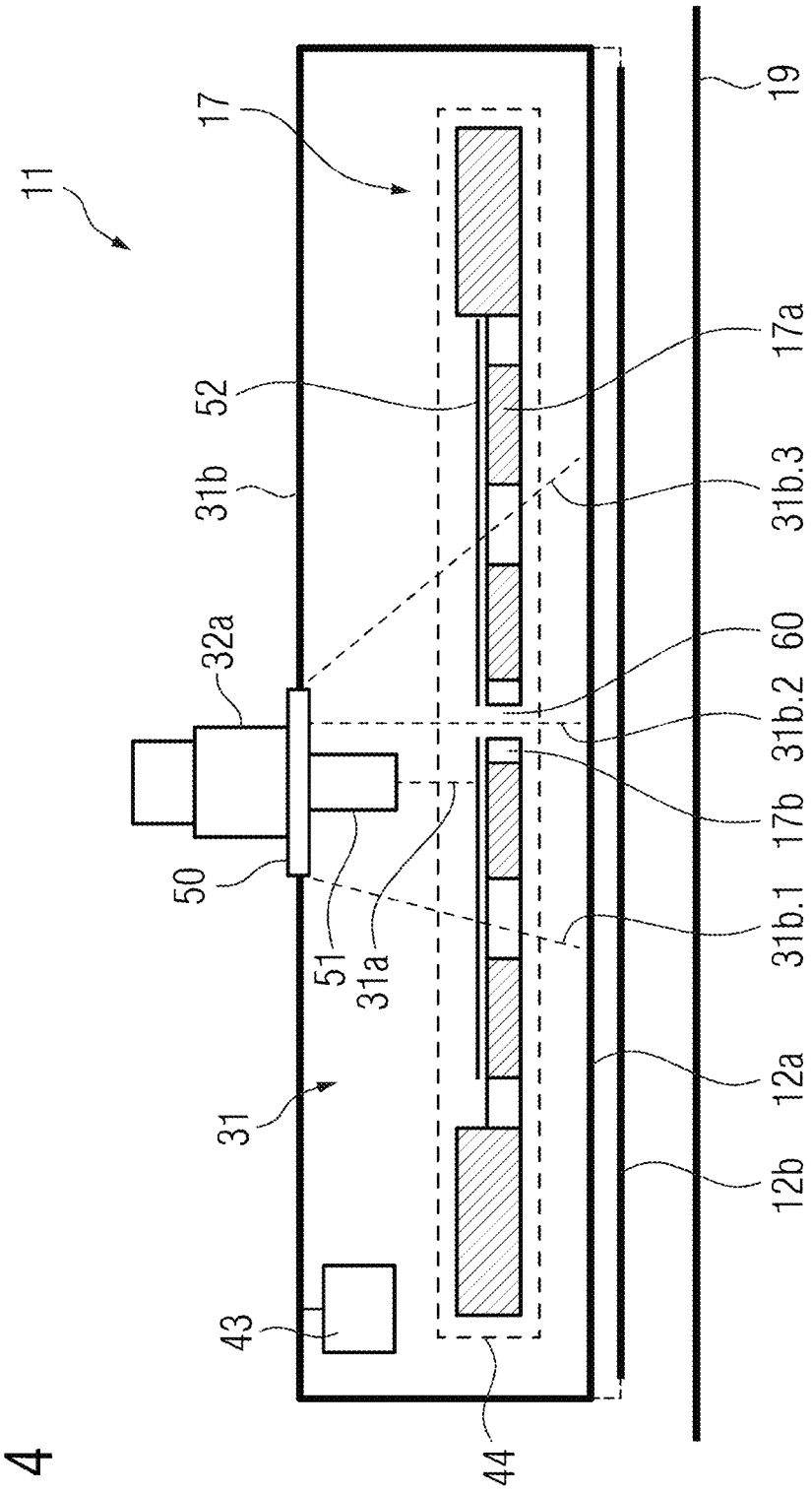
FIG. 4 illustrates a schematic representation of an embodiment of an example magnetic resonance imaging device.

FIG. 4 shows another embodiment of the magnetic resonance imaging device 11. In the depicted example, the thermal bus structure 31 (shown in dashed lines) provides mechanical support to components of the field generation unit 30, such as the buffer unit 43, the electromagnetic shield 12b, the thermal shield 12a and the like. The thermal shield 12a may be implemented as a cylinder or bore tube encompassing the imaging region 36 along a circumferential direction. The thermal shield 12a may be configured to provide mechanical support to the main magnet 17 and/or other components of the magnetic resonance imaging device 11. The thermal shield 12a may be encompassed by a vacuum chamber 49 as shown in FIG. 2.

In the embodiment shown in FIG. 4, the main magnet 17 comprises a heat-insulating layer 44 configured for reducing a heat exchange between the main magnet 17 and its surroundings. The heat-insulating layer 44 may have a low thermal emissivity and reduce heat radiation onto the main magnet 17. For example, the heat-insulating layer 44 may consist of a wrapping of aluminized mylar.

The thermal bus structure 31 comprises a first thermal bus element 31b configured for providing a direct thermal connection between the first stage 50 of the cold head 32a and the shield structure 12 and a second thermal bus element 31a configured for providing a direct thermal connection between a second stage 51 of the cold head 32a and the main magnet 17. The temperature level of the first stage 50 of the cold head 32a exceeds the temperature level of the second stage 51 of the cold head 32a.

The thermal bus element 31a may provide a thermal connection between the second stage 51 of the cold head 32a and the main magnet 17 or a heat spreader 52 thermally contacting the superconducting coils 17a of the main magnet 17. The thermal bus element 31a may extend through one side of the heat-insulating layer 44 and/or be wrapped or enclosed in a heat-insulating layer itself.

As shown in FIG. 4, one or more thermal bus elements 31b may be arranged at non-perpendicular angles with respect to the orientation of the main magnetic field 18 (as indicated in FIG. 1) within the imaging region 36 of the magnetic resonance imaging device 11 to improve a mechanical stability or the mechanical support provided via the thermal bus structure 31. The thermal bus structure 31 may comprise at least one thermal bus element 31a or 31b arranged at a non-perpendicular angle with respect to the main orientation of magnetic field lines within the imaging region 36 of the magnetic resonance imaging device 11 to provide improved mechanical support to individual components of the magnetic resonance imaging device 11.

The at least one thermal bus element and/or the plurality of thermal bus elements may also be arranged at non-perpendicular angles with respect to a second direction (not shown). The second direction may be oriented orthogonally to the orientation of the main magnetic field 18 within the imaging region 36 and in parallel to a plane defined by a supporting surface of a patient support 12 (see FIG. 1) configured for supporting the patient 15 during a magnetic resonance examination.

FIG. 5 shows an embodiment of the magnetic resonance imaging device 11, wherein at least one thermal bus element 31i extends through the magnet spacer 17b of the main magnet 17. In the depicted example, the main magnet 17 is encompassed by or wrapped in a heat-insulating layer 44. The inner surface 17c of the hole 60 in the magnet spacer 17b is covered by the heat-insulating material 44 to reduce a heat exchange between the magnet spacer 17b and the thermal bus element 31i.

In the embodiment depicted in FIG. 6, the shield structure 12 comprises an electromagnetic shield 12b configured for providing an electromagnetic shielding of the main magnet 17 from a magnetic field generated by the at least one gradient coil of the gradient system 19. The electromagnetic shield 12b comprises a plurality of spaced shield elements 12b.1 and 12b.2 thermally connected to the cold head 32a via a plurality of thermal bus elements 31i. In FIG. 6, a depiction of the main magnet 17 is omitted. A thermal connection between the main magnet 17 and the cold head 32a may be implemented according to an embodiment described above.

As shown in FIG. 4, the thermal bus structure 31 is configured to provide mechanical support to the shield structure 12, e.g. the electromagnetic shield 12b.

In the example shown in FIG. 6, the plurality of spaced shield elements 12b.1 and 12b.2 is clamped to the thermal shield 12a via a bolt 71 and a supporting element 70. One or more thermal bus elements 31i thermally connected to the cold head 32a may branch out and thermally connect to the spaced shield elements 12b.1 and 12b.2. It is also conceivable, however, that the spaced shield elements 12b.1 and 12b.2 are thermally connected to the cold head 32a via a plurality of separate or disjoint thermal bus elements 31i, mechanically connected only at the cold head 32a. One or more thermal bus elements 31i may extend through a hole (not shown) in the thermal shield 12a, thus avoiding contact with the thermal shield 12a. However, the thermal bus elements 31i may also thermally connect to both the electromagnetic shield 12b and the thermal shield 12a (as well as other components of the magnetic resonance imaging device 11, such as the buffer unit 43).

A clamping force exerted via the bolt 71 and the supporting element 70 may be used for an individualized tuning of a heat exchange between the thermal shield 12a and the plurality of shield elements 12b.1 and 12b.2. Thus, a heat transfer area for removing heat from the electromagnetic shield 12b may favorably be increased.

A thermal bus structure 31 according to FIG. 6 may be implemented in both "dry systems" or conventional "wet systems" comprising a cryogen vessel.

Figure 7:
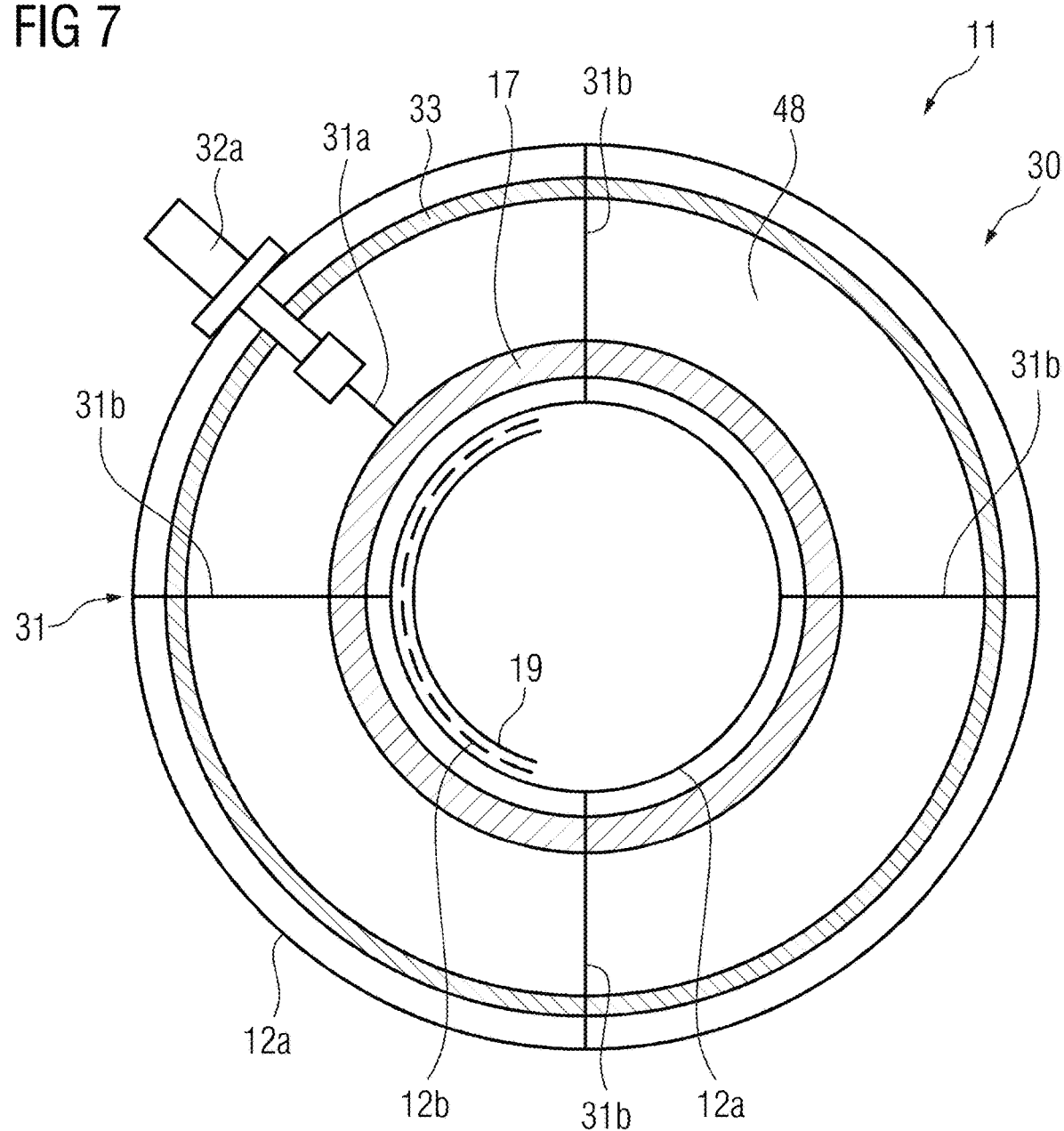
FIG. 7 illustrates a schematic representation of an embodiment of an example magnetic resonance imaging device.

FIG. 7 shows a cross section of an embodiment of an magnetic resonance imaging device 11. In the depicted example, the magnetic resonance imaging device 11 comprises a thermal shield 12a enclosing the main magnet 17 and the outer shield 33 in an interior volume 48. The thermal shield 12a may be encompassed by a vacuum chamber 49 as depicted in FIG. 2. The main magnet 17 and/or the outer shield 33 may be mechanically connected to the thermal shield 12a. For example, a part or a section of the thermal bus structure 31 connected to the thermal shield 12a provides mechanical support to the main magnet 17 and/or the outer shield 33. In the present embodiment, the main magnet 17 may be covered by a heat-insulating layer 44 (see FIG. 4).

The thermal bus structure 31 comprises a plurality of thermal bus elements 31b mechanically connecting an outer bore tube and an inner bore tube of the magnetic resonance imaging device 11. The outer bore tube and the inner bore tube may represent an outer surface and an inner surface of the thermal shield 12a. In contrast to the embodiment shown in FIG. 3, the thermal bus elements 31b may extend in an axial direction in parallel to an axis of rotational symmetry of the magnetic resonance imaging device 11. Thus, an increased mechanical support of the outer bore tube and/or the inner bore tube may be provided via the thermal bus structure 31. The cold head 32a may be thermally connected and/or mounted to the outer bore tube.

The thermal connection between the cold head 32a and the main magnet 17 is provided via one or more thermal bus elements 31a. The electromagnetic shield 12b and the gradient system 19 arranged within the inner bore tube are partially shown merely to illustrate their location within the field generation unit 30.

Figure 8:
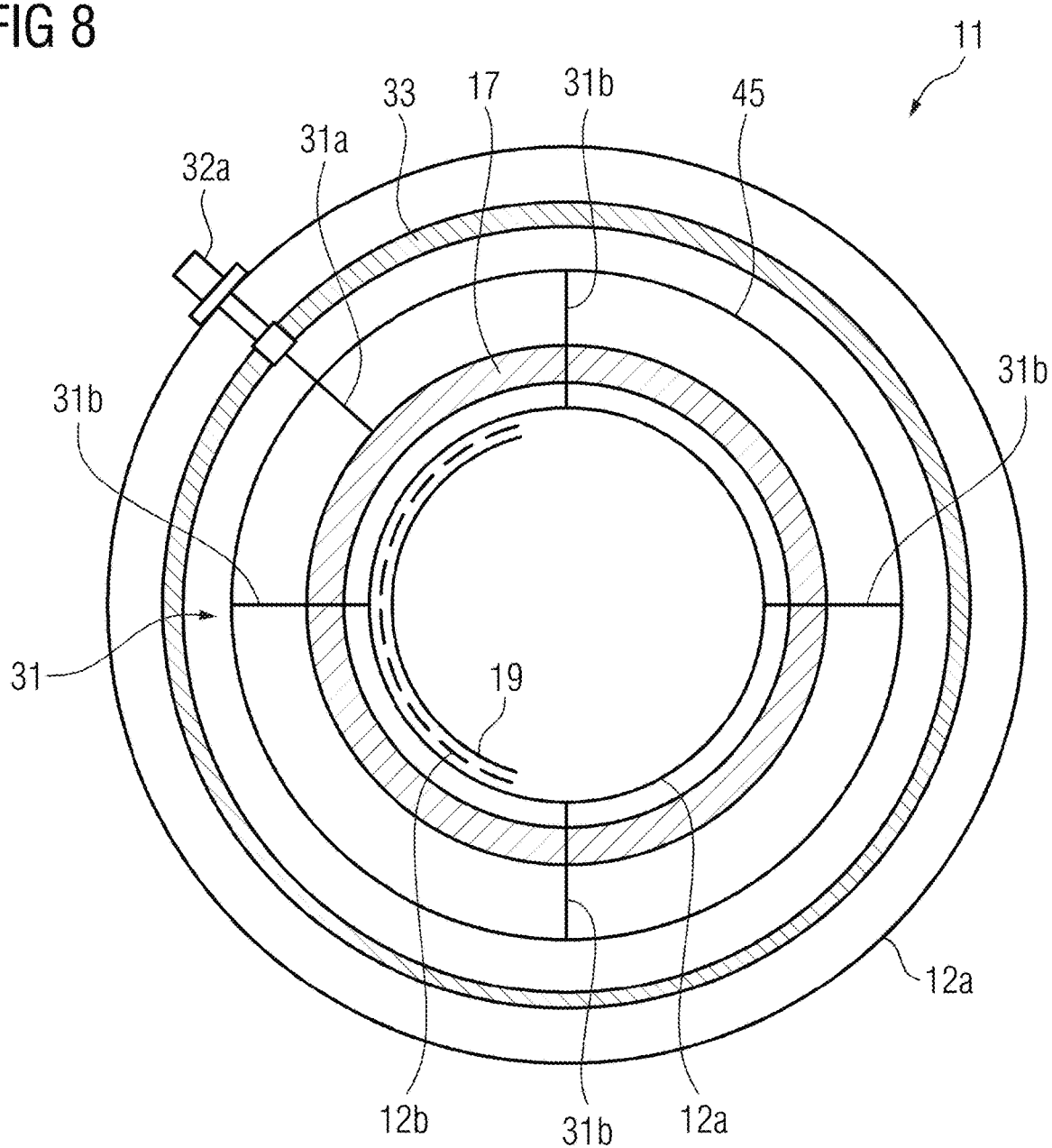
FIG. 8 illustrates a schematic representation of an embodiment of an example magnetic resonance imaging device.

FIG. 8 shows a cross section of an embodiment of the magnetic resonance imaging device 11 comprising an intermediate support structure 45 or intermediate support cylinder arranged between the outer shield 33 and the main magnet 17. The intermediate support structure 45 may form a part of the thermal bus structure 31. However, the intermediate support structure 45 may also represent a mechanical support structure separate from the thermal bus structure 31. It is also conceivable that the thermal bus structure 31, i. e. the depicted thermal bus elements 31b, provides mechanical support to the intermediate support structure 45 and the thermal shield 12a. The cold head 32a may be mounted to or carried by the intermediate support structure 45 and/or the thermal bus structure 31.

The embodiment of the magnetic resonance imaging device 11 according to FIG. 8 may be well-suited for "dry systems" without a cryogen vessel.

Figure 9:
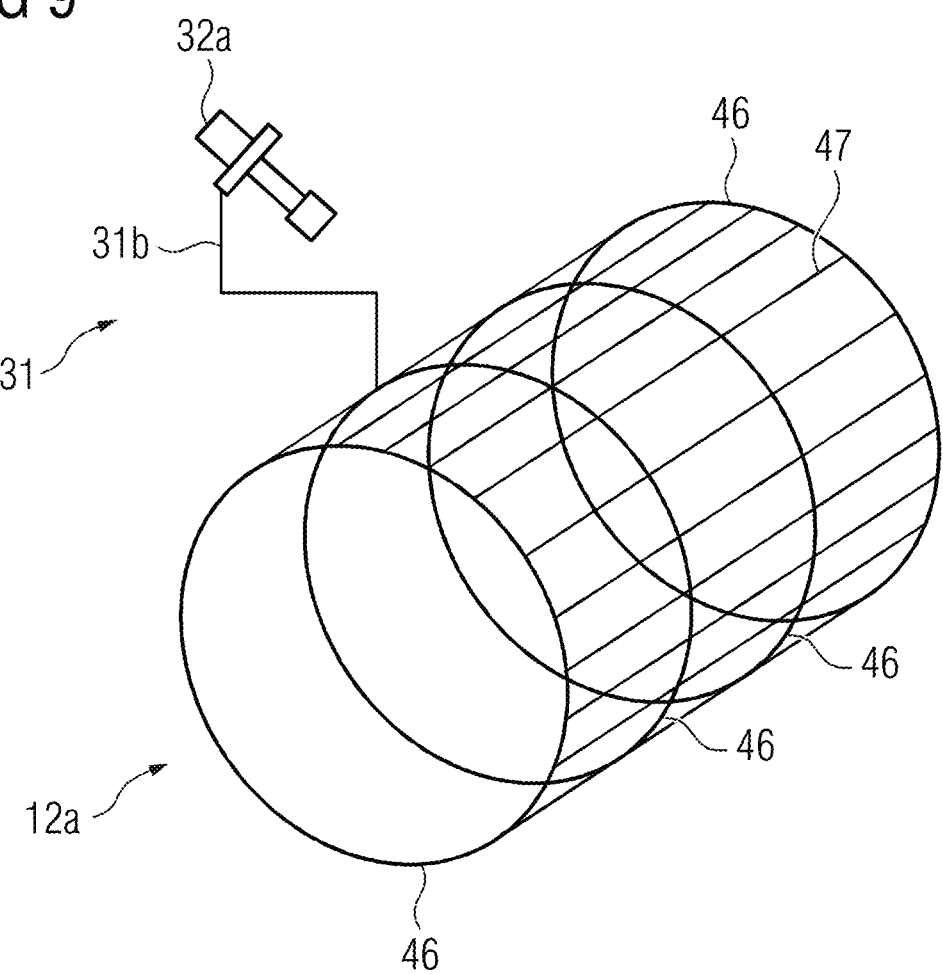
FIG. 9 illustrates a schematic representation of an embodiment of a thermal shield in an example magnetic resonance imaging device.

FIG. 9 shows an embodiment of a thermal shield 12a. In the depicted example, the thermal shield 12a comprises a plurality of concentric, axially spaced rings 46 mechanically connected via a plurality of struts 47 oriented in parallel to a cylinder axis defined by the plurality of rings 46.

The thermal shield 12a may be implemented as a "bird cage." In one embodiment, the struts 47 connecting the plurality of concentric, axially spaced rings 46 are implemented as bars or rods made of stainless steel. One or more struts 47, but also one or more axially spaced rings 46, may be thermally connected to the first stage of the cold head via at least one thermal bus element 31b.

The thermal bus structure 31 may form a part of the thermal shield 12a. For example, one or more struts 47 and/or one or more rings 46 may represent thermal bus elements 31i and/or constitute a part of the thermal bus structure 31.

The thermal shield 12a is mechanically connected at least to the thermal bus structure 31, an intermediate support structure 45, an outer bore tube and/or a further component of the cryostat 42.

The embodiments described above are merely examples of the magnetic resonance imaging device. It is to be understood that individual embodiments may be extended by or combined with features of other embodiments if not stated otherwise.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. A magnetic resonance imaging device, comprising:
a main magnet including a magnet spacer configured to maintain a predefined positional relationship between separate coils of the main magnet;
a gradient system including a gradient coil;
a shield structure arranged between the gradient system and the main magnet, the shield structure comprising a thermal shield and an electromagnetic shield that are separate from one another, the thermal shield being configured to reduce a transport of heat energy to the main magnet;
a cryocooler including a cold head; and
a thermal bus structure including a thermal bus element extending through the magnet spacer for providing a thermal connection between the cold head of the cryocooler and the thermal shield of the shield structure.

2. The magnetic resonance imaging device according to claim 1, wherein:
the electromagnetic shield is configured to shield the main magnet from a magnetic field generated by the gradient coil,
the shield structure comprises a plurality of spaced shield elements,
the thermal bus structure comprises a plurality of thermal bus elements, and
the plurality of thermal bus elements provide a thermal connection between the plurality of spaced shield elements and the cold head of the cryocooler.

3. The magnetic resonance imaging device according to claim 2, wherein the plurality of thermal bus elements are configured to provide mechanical support to the plurality of spaced shield elements.

4. The magnetic resonance imaging device according to claim 2, wherein the thermal shield of the shield structure are is configured to provide mechanical support to the plurality of spaced shield elements.

5. The magnetic resonance imaging device according to claim 2, wherein two thermal bus elements of the plurality of thermal bus elements comprise different heat transfer properties to provide an individualized temperature control of two spaced shield elements.

6. The magnetic resonance imaging device according to claim 1, wherein the thermal bus structure comprises an intermediate support structure arranged between the main magnet and an outer shield coil.

7. The magnetic resonance imaging device according to claim 1, wherein the shield structure forms a part of a cryostat surrounding the main magnet, and
wherein the thermal bus element extends through a cryogen vessel of the cryostat to provide a thermal connection between a first inner surface and a second inner surface of the shield structure.

8. The magnetic resonance imaging device according to claim 1, wherein:
the shield structure forms a part of a cryostat surrounding the main magnet,
the thermal bus element is configured to provide a direct thermal connection between a surface of the shield structure and the cold head of the cryocooler, and
the surface of the shield structure is dissimilar to a surface of the shield structure for mounting the cold head.

9. The magnetic resonance imaging device according to claim 1, wherein the thermal bus structure comprises:
a first thermal bus element configured to provide a direct thermal connection between a first stage of the cold head and the shield structure; and
a second thermal bus element configured to provide a direct thermal connection between a second stage of the cold head and the main magnet,
wherein a first temperature level of the first stage of the cold head exceeds a second temperature level of the second stage of the cold head.

10. The magnetic resonance imaging device according to claim 9, further comprising:
a buffer configured to provide and/or to receive heat energy,
wherein the thermal bus element provides a thermal connection between the buffer and the cold head of the cryocooler.

11. The magnetic resonance imaging device according to claim 1, wherein the thermal bus element comprises a solid thermal conductor.

12. The magnetic resonance imaging device according to claim 1, wherein the thermal bus element comprises a heat pipe.

13. The magnetic resonance imaging device according to claim 1, wherein the thermal bus structure is configured to provide mechanical support to a section of the shield structure.

14. The magnetic resonance imaging device according to claim 1, wherein the thermal bus structure comprises a plurality of thermal bus elements arranged at a non-perpendicular angle with respect to an orientation of a main magnetic field within an imaging region of the magnetic resonance imaging device.

15. The magnetic resonance imaging device according to claim 14, wherein the plurality of thermal bus elements are arranged at non-perpendicular angles with respect to a direction that is oriented (i) orthogonal to the orientation of the main magnetic field within the imaging region, and (ii) parallel to a plane defined by a supporting surface of a patient support configured to support a patient during a magnetic resonance examination.

16. The magnetic resonance imaging device according to claim 1, wherein the thermal bus structure comprises a plurality of thermal bus elements, and
   wherein the plurality of thermal bus elements are arranged at non-perpendicular angles with respect to a direction that is oriented (i) orthogonal to the orientation of the main magnetic field within an imaging region of the magnetic resonance imaging device, and (ii) parallel to a plane defined by a supporting surface of a patient support configured to support a patient during a magnetic resonance examination.

17. The magnetic resonance imaging device according to claim 1, wherein magnet spacer comprise a hole that provides a passageway for routing the thermal bus element between the cold head and the thermal shield.

18. The magnetic resonance imaging device according to claim 1, wherein the thermal bus element comprises a ring encompassing an imaging region of the magnetic resonance imaging device along a circumferential direction of a main magnet, and
   wherein the thermal bus element extends through a plurality of holes distributed along the circumference of the main magnet.

19. A magnetic resonance imaging device, comprising:
   a main magnet including a magnet spacer configured to maintain a predefined positional relationship between separate coils of the main magnet,
   wherein the main magnet is surrounded by a heat-insulating layer;
   a gradient system including a gradient coil;
   a shield structure arranged between the gradient system and the main magnet, the shield structure being configured to reduce a transport of heat energy to the main magnet;
   a cryocooler including a cold head; and
   a thermal bus structure including a thermal bus element extending through the magnet spacer for providing a thermal connection between the cold head of the cryocooler and the shield structure,
   wherein an inner surface of a hole in the magnet spacer, which provides a passageway for the thermal bus element, is covered by the heat-insulating layer to reduce a heat exchange between the magnet spacer and the thermal bus element.

20. A magnetic resonance imaging device, comprising:
   a main magnet including a magnet spacer configured to maintain a predefined positional relationship between separate coils of the main magnet;
   a gradient system including a gradient coil;
   a shield structure arranged between the gradient system and the main magnet, the shield structure being configured to reduce a transport of heat energy to the main magnet,
   wherein a section of the shield structure comprises a plurality of concentric, axially spaced rings mechanically connected via a plurality of struts oriented in parallel with a cylinder axis defined by the plurality of concentric, axially spaced rings;
   a cryocooler including a cold head; and
   a thermal bus structure including a thermal bus element extending through the magnet spacer for providing a thermal connection between the cold head of the cryocooler and the shield structure.

* * * * *